(12) United States Patent
Hartman et al.

(10) Patent No.: US 11,829,212 B2
(45) Date of Patent: Nov. 28, 2023

(54) POWER DISTRIBUTION SYSTEM FOR AN INFORMATION HANDLING SYSTEM

(71) Applicant: Dell Products L.P., Round Rock, TX (US)

(72) Inventors: Corey D. Hartman, Hutto, TX (US); Timothy M. Lambert, Austin, TX (US); Isaac Q. Wang, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 250 days.

(21) Appl. No.: 17/448,988

(22) Filed: Sep. 27, 2021

(65) Prior Publication Data

US 2023/0102559 A1    Mar. 30, 2023

(51) Int. Cl.
| | |
|---|---|
| *G06F 1/26* | (2006.01) |
| *G06F 1/18* | (2006.01) |
| *H05K 1/11* | (2006.01) |
| *G06F 1/20* | (2006.01) |
| *G06F 1/3203* | (2019.01) |

(52) U.S. Cl.
CPC .............. *G06F 1/189* (2013.01); *G06F 1/20* (2013.01); *H05K 1/118* (2013.01); *G06F 1/3203* (2013.01)

(58) Field of Classification Search
CPC ........... G06F 1/189; G06F 1/20; H05K 1/118; H05K 7/20
USPC ........................................................ 713/300
See application file for complete search history.

(56) References Cited

U.S. PATENT DOCUMENTS

| | | | | |
|---|---|---|---|---|
| 5,936,836 | A * | 8/1999 | Scholder | H05K 7/1431 165/104.34 |
| 6,583,988 | B1 * | 6/2003 | Lyons | H05K 7/20854 165/185 |
| 2004/0048039 | A1 * | 3/2004 | Hornung | H05K 7/2049 428/131 |
| 2005/0237724 | A1 * | 10/2005 | Fiorentino | G06F 1/189 361/752 |
| 2006/0164811 | A1 * | 7/2006 | Maxwell | H05K 7/209 361/709 |
| 2023/0210453 | A1 * | 7/2023 | Brawn | A61C 19/06 433/6 |

* cited by examiner

*Primary Examiner* — Volvick Derose
(74) *Attorney, Agent, or Firm* — McDermott Will & Emery LLP

(57) ABSTRACT

In one embodiment, a method for distributing power using a power distribution system includes: receiving, by a first power distribution end of a power conductor of the power distribution system, power from a power supply unit via a first cable coupled to the power supply unit, the first power distribution end coupled to a first connector, the first connector including a first power interface coupling the first power distribution end to the first cable, the power conductor contoured to removably couple to a heatsink of the information handling system; and providing, by a second power distribution end of the power conductor, the power to a component of the information handling system via a second cable coupled to the component, the second power distribution end coupled to a second connector, the second connector including a second power interface coupling the second power distribution end to the second cable.

20 Claims, 7 Drawing Sheets

700

RECEIVE, BY A FIRST POWER DISTRIBUTION END OF A POWER CONDUCTOR, POWER FROM A POWER SUPPLY UNIT VIA A FIRST CABLE COUPLED TO THE POWER SUPPLY UNIT.
710

PROVIDE, BY A SECOND POWER DISTRIBUTION END OF THE POWER CONDUCTOR, THE POWER TO A COMPONENT OF AN INFORMATION HANDLING SYSTEM VIA A SECOND CABLE COUPLED TO THE COMPONENT.
720

FIG. 7

POWER DISTRIBUTION SYSTEM FOR AN INFORMATION HANDLING SYSTEM

BACKGROUND

Field of the Disclosure

The disclosure relates generally to information handling systems, and in particular to a power distribution system for an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one embodiment, a disclosed method for distributing power using a power distribution system for an information handling system includes: receiving, by a first power distribution end of a power conductor of the power distribution system, power from a power supply unit via a first cable coupled to the power supply unit, the first power distribution end coupled to a first connector, the first connector including a first power interface coupling the first power distribution end to the first cable, the power conductor contoured to removably couple to a heatsink of the information handling system; and providing, by a second power distribution end of the power conductor, the power to a component of the information handling system via a second cable coupled to the component, the second power distribution end coupled to a second connector, the second connector including a second power interface coupling the second power distribution end to the second cable.

In one or more of the disclosed embodiments, the method further includes: receiving, by a first signal distribution end of a signal distribution circuit of the power distribution system, one or more management signals from the information handling system via the first cable, the first signal distribution end coupled to the first connector, the first connector including a first management interface communicably coupling the first signal distribution end to the first cable, the signal distribution circuit contoured to removably couple to the power conductor and the heatsink; and providing, by a second signal distribution end of the signal distribution circuit, the one or more management signals to the component via the second cable, the second signal distribution end coupled to the second connector, the second connector including a second management interface communicably coupling the second signal distribution end to the second cable.

In one or more of the disclosed embodiments, the power conductor is contoured to removably couple to the heatsink proximate to a base of the heatsink.

In one or more of the disclosed embodiments, the power conductor is contoured to removably couple to the heatsink via a cradle unit disposed within a recessed portion of the heatsink.

In one or more of the disclosed embodiments, the power conductor is electrically isolated from the heatsink.

In one or more of the disclosed embodiments, the power conductor comprises a busbar.

In one or more of the disclosed embodiments, the signal distribution circuit comprises a flexible printed circuit board (PCB).

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 7 is a flowchart depicting selected elements of an embodiment of a method for distributing power using a power distribution system for an information handling system.

DESCRIPTION OF PARTICULAR EMBODIMENT(S)

Figure 1:
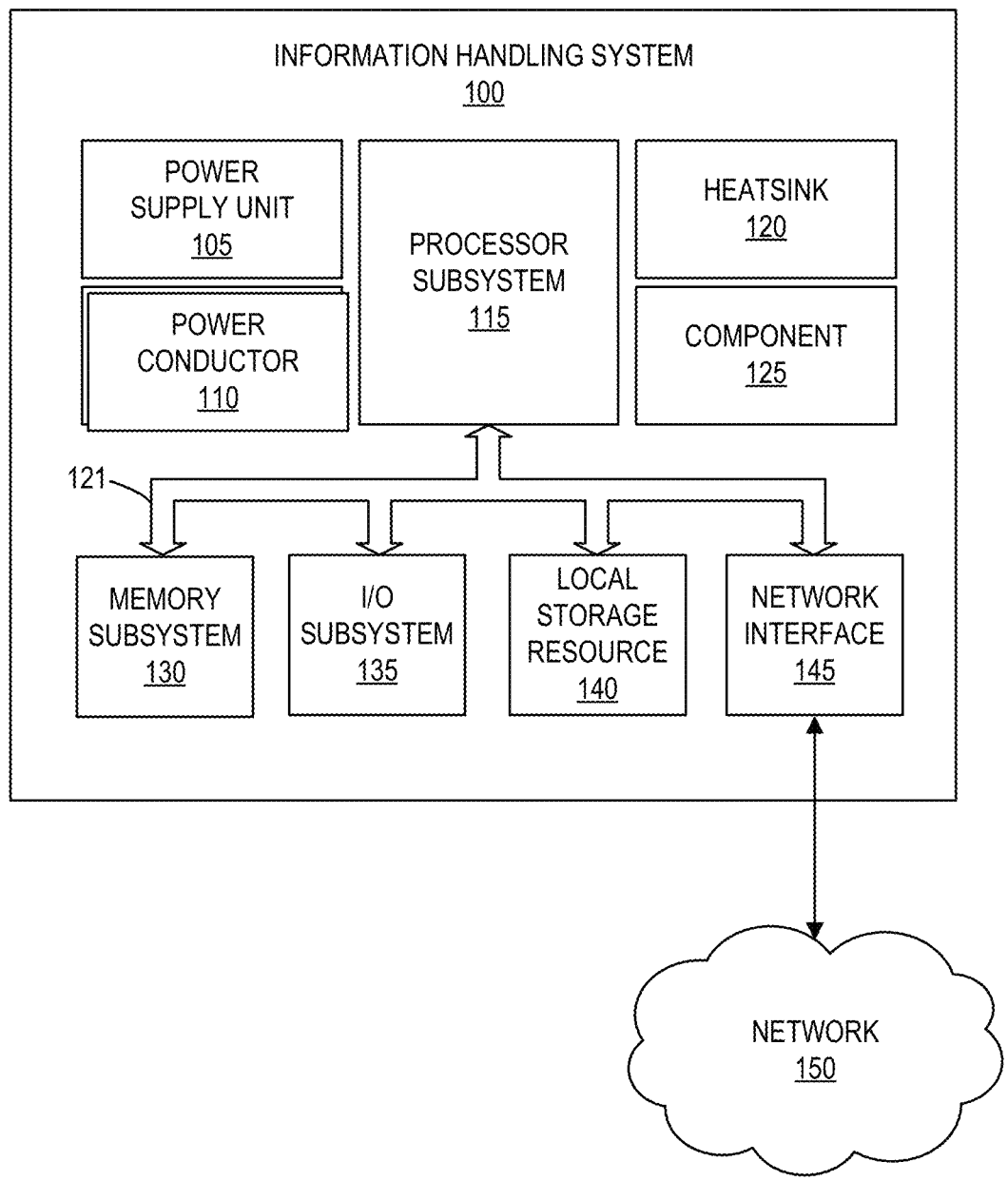
FIG. 1 is a block diagram of selected elements of an embodiment of a computing environment that includes an information handling system.

This document describes a method for distributing power using a power distribution system for an information handling system that includes: receiving, by a first power distribution end of a power conductor of the power distribution system, power from a power supply unit via a first cable coupled to the power supply unit, the first power distribution end coupled to a first connector, the first connector including a first power interface coupling the first power distribution end to the first cable, the power conductor contoured to removably couple to a heatsink of the information handling system; and providing, by a second power distribution end of the power conductor, the power to a component of the information handling system via a second cable coupled to the component, the second power distribution end coupled to a second connector, the second connector including a second power interface coupling the second power distribution end to the second cable.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 is a block diagram of selected elements of an embodiment of a computing environment that includes an information handling system. Specifically, FIG. 1 illustrates a block diagram depicting selected elements of an information handling system 100 in accordance with some embodiments of the present disclosure. In other embodiments, information handling system 100 may represent different types of portable information handling systems, such as, display devices, head mounted displays, head mount display systems, smart phones, tablet computers, notebook computers, media players, foldable display systems, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems.

In the embodiment illustrated in FIG. 1, components of information handling system 100 may include, but are not limited to, a processor subsystem 115, which may comprise one or more processors, and system bus 121 that communicatively couples various system components to processor subsystem 115 including, for example, a memory subsystem 130, an I/O subsystem 135, a local storage resource 140, and a network interface 145. System bus 121 may represent a variety of suitable types of bus structures (e.g., a memory bus, a peripheral bus, or a local bus) using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express (PCIe) bus, HyperTransport (HT) bus, and Video Electronics Standards Association (VESA) local bus. As shown in FIG. 1, information handling system 100 may additionally include a power supply unit 105, one or more power conductors 110, a heatsink 120, and a component 125. In other embodiments, computing environment 155 may include additional, fewer, and/or different components than the components shown in FIG. 1.

In information handling system 100, processor subsystem 115 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 115 may interpret and/or execute program instructions and/or process data stored locally (e.g., in memory subsystem 130 and/or another component of information handling system 100). In the same or alternative embodiments, processor subsystem 115 may interpret and/or execute program instructions and/or process data stored remotely. In one embodiment, processor subsystem 115 may be or include a multi-core processor comprised of one or more processing cores disposed upon an integrated circuit (IC) chip. In other embodiments, processor subsystem 115 may be or include an integrated device (e.g., microcontroller, system on a chip (SoC), and the like) that includes memory, peripheral interfaces, and/or other components suitable for interpreting and/or executing program instructions and/or processing data.

In one embodiment, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In one embodiment, I/O subsystem 135 may comprise a system, device, or apparatus generally operable to receive and/or transmit data to, from, and/or within information handling system 100. I/O subsystem 135 may represent, for example, a variety of communication interfaces, graphics interfaces, video interfaces, user input interfaces, and/or peripheral interfaces. In various embodiments, I/O subsystem 135 may be used to support various peripheral devices, such as a touch panel, a display adapter, a keyboard, an accelerometer, a touch pad, a gyroscope, an IR sensor, a microphone, a sensor, a camera, or another type of peripheral device.

In one embodiment, local storage resource 140 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data.

In one embodiment, network interface 145 may be a suitable system, apparatus, or device operable to serve as an interface between information handling system 100 and a network 150. Network interface 145 may enable information handling system 100 to communicate over network 150 using a suitable transmission protocol and/or standard, including, but not limited to, transmission protocols and/or standards enumerated below with respect to the discussion of network 150. Network 150 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 145 may enable wired and/or wireless communications (e.g., NFC or Bluetooth) to and/or from information handling system 100.

In particular embodiments, network 150 may include one or more routers for routing data between client information handling systems 100 and server information handling systems 100. A device (e.g., a client information handling system 100 or a server information handling system 100) on network 150 may be addressed by a corresponding network address including, for example, an Internet protocol (IP) address, an Internet name, a Windows Internet name service (WINS) name, a domain name or other system name. In particular embodiments, network 150 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

In one embodiment, network 150 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 150 and its various components may be implemented using hardware, software, or any combination thereof.

In one embodiment, power supply unit 105 may be a suitable system, apparatus, or device operable to supply, or otherwise provide, power to component 125. In particular, power supply unit 105 may be or include an electronic hardware device operable to supply, or otherwise provide, power to components within information handling system 100. In one embodiment, power supply unit 105 may convert alternating current (AC) to a low-voltage, regulated direct current (DC) supplied to internal components of information handling system 100. Here, power supply unit 105 may supply power to internal components via an auxiliary (AUX) power cable. For example, power supply unit 105 may be or include a voltage regulator operable to supply power to component 125 via cables 350 and 360 shown in FIG. 3.

In one embodiment, heatsink 120 may be a suitable system, apparatus, or device operable to transfer heat away from one or more devices of information handling system 100. Specifically, heatsink 120 may be or include a heat exchanger comprised of metal (e.g., copper, aluminum alloy, and the like) operable to absorb heat generated by one or more devices of information handling system 100 and to dissipate the absorbed heat away from the one or more devices, thereby managing respective temperatures of the one or more devices. In one embodiment, heatsink 120 may be comprised of, or otherwise include, one or more fins (not shown in figure) used to emit warm air absorbed by heatsink 120. In this embodiment, a fan may provide a directed airflow across heatsink 120 used to dissipate the warm air emitted from the one or more fins of heatsink 120 to complete the heat exchange. In one embodiment, heatsink 120 may be or include an active heatsink removably coupled to one or more fans to receive a directed airflow. In other embodiments, heatsink 120 may be or include a passive heatsink, a stamped fin heatsink, a bonded fin heatsink, a skived heatsink, and/or any other type of heatsink suitable for transferring heat away from one or more devices of information handling system 100. Heatsink 120 is described in further detail with respect to FIGS. 2-6.

In one embodiment, component 125 may be a suitable system, apparatus, or device operable to perform one or more operations for information handling system 100. In particular, component 125 may be or include an electronic hardware device operable to receive power generated by power supply unit 105 via one or more AUX power cables (e.g., cables 350 and 360 shown in FIG. 3) and to perform one or more operations for information handling system 100. In one embodiment, component 125 may be or include one or more storage devices. For example, component 125 may be or include one or more flash memory devices, optical storage devices, hard disk drives (HDDs), solid-state drives (SSDs), and the like. In another embodiment, component 125 may be or include one or more electronic devices. For example, component 125 may be or include one or more graphics processing units (GPUs), backplanes, fan modules, peripheral component interconnect express (PCIe) riser cards, and the like. In other embodiments, component 125 may be or include one or more input devices, output devices, and/or any other type of system apparatus, or device operable to perform one or more operations for information handling system 100.

In one embodiment, each power conductor 110 (collectively referred to herein as "power conductors 110") may be a suitable system, apparatus, or device operable to transfer, or otherwise distribute, power to component 125. Specifically, power conductor 110 may be or include a conducting element (e.g., a busbar, metallic strip, and the like) comprised of a rigid material (e.g., copper, brass, aluminum, and the like) operable to receive power from power supply unit 105 and to provide power to component 125. That is, power conductor 110 may receive a current (e.g., direct current, alternating current, and the like) generated by power supply unit 105 and may transfer the current to component 125 such that component 125 may receive power via power conductor 110 and become operable for use. Conventionally, such power distribution from a power supply unit to one or more components typically requires complex routing schemes through multiple devices disposed upon a surface of a motherboard, or other architecture, within a chassis of an information handling system. For example, power may be routed from a power supply unit to one or more components underneath the multiple devices via traces, or tracks, within a dedicated printed circuit board (PCB) coupled to, or otherwise embedded within, a motherboard. In another example, power may be routed from a power supply unit to one or more components via a power cable routed between devices and an interior wall of the chassis within an information handling system. However, such conventional solutions may increase cost (e.g., for a user and/or business enterprise) as a dedicated PCB may require multiple layers comprised of costly material (e.g., approximately $20 per layer). In addition, such conventional solutions may require modifications to the existing chassis architecture, further increasing cost as newer generations of components may require increased power over previous generations.

Figure 2:
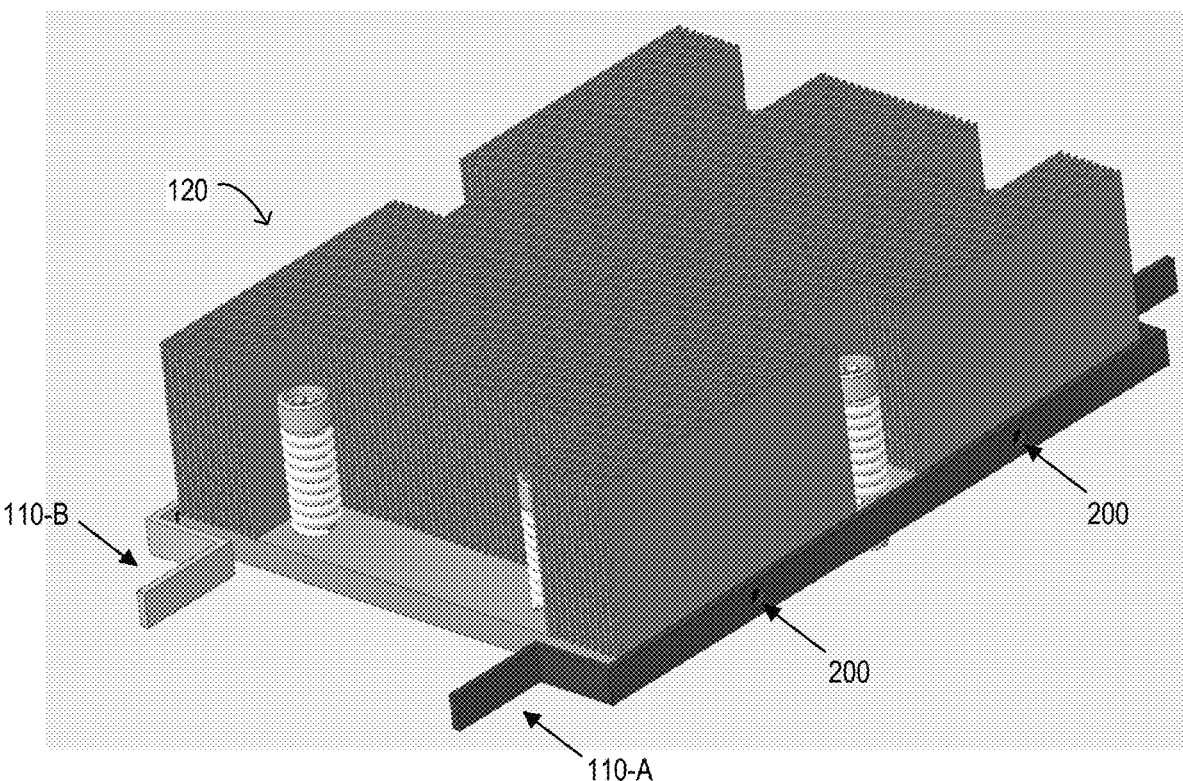
FIG. 2 illustrates selected elements of an embodiment of a power distribution system that includes power conductors coupled to a heatsink.

In contrast, power conductor 110 may be contoured to be removably coupled to one or more devices of information handling system 100 such that power generated by power supply unit 105 may be provided to component 125 without requiring modification to the existing chassis architecture. In one embodiment, power conductor 110 may include one or more right angles (e.g., as shown in FIG. 2) such that the body of power conductor 110 may be removably coupled to heatsink 120. For example, power conductor 110 may be removably coupled to heatsink 120 proximate to the base of heatsink 120 such that power may be routed around heatsink 120 and provided to component 125. In another embodiment, power conductor 110 may include a cradle unit (e.g., as shown in FIG. 6) disposed within one or more recessed portions of heatsink 120 such that the power may be routed accordingly. In other embodiments, power conductor 110 may be routed through an interior portion of heatsink 120, routed underneath heatsink 120, routed above heatsink 120, and/or any other routing scheme suitable for providing power to component 125. In one embodiment, power conductor 110 may be or include a busbar. In other embodiments, power conductor 110 may be or include a power cable, a metallic sheathed cable, a communications cable, single busbar, double busbar, sectionalized double busbar, and/or any other type of system, apparatus, or device suitable to transfer, or otherwise distribute, power to component 125. Power conductor 110 is described in further detail with respect to FIGS. 2-6.

FIG. 2 illustrates selected elements of an embodiment of a power distribution system that includes power conductors coupled to a heatsink. In particular, the power distribution system may include power conductors 110-A and 110-B removably coupled to heatsink 120. In the embodiment illustrated in FIG. 2, power conductor 110-A may be or include an energized, or "hot," rail used to provide power to component 125 as described above. Power conductor 110-B may be or include a ground rail used to provide power to a ground within chassis (not shown in figure). As shown in FIG. 2, power conductors 110 may be contoured to removably couple to heatsink 120 such that no modification to heatsink 120 and/or the existing chassis architecture is required. Here, power conductors 110 may be removably coupled to the base of heatsink 120 using one or more mechanical fasteners. In the embodiment illustrated in FIG. 2, power conductors 110 may be removably coupled to heatsink 120 using one or more screws and/or rivets attached, or otherwise coupled, to heatsink 120 via screw holes 200.

In one embodiment, power conductors 110 may be electrically isolated from heatsink 120. Specifically, each power conductor 110-A and 110-B may be electrically isolated from heatsink 120 to prevent power conductors 110 from energizing heatsink 120. For example, power conductors 110 may be powder coated and/or painted to electrically isolate power conductors 110 from heatsink 120, thereby preventing power conductors 110 from energizing one or more fins of heatsink 120. In doing so, power conductors 110 may removably couple to heatsink 120 to effectively route power from power supply unit 105 to component 125 without altering the ability of heatsink 120 to transfer heat away from one or more devices of information handling system 100. Thus, the power distribution system allows power to be distributed to devices throughout information handling system 100 without requiring modification to the existing chassis architecture and/or causing a decrease in the performance of heatsink 120. In other embodiments, the power distribution system may include additional, fewer, and/or different components than the components shown in FIG. 2.

Figure 3:
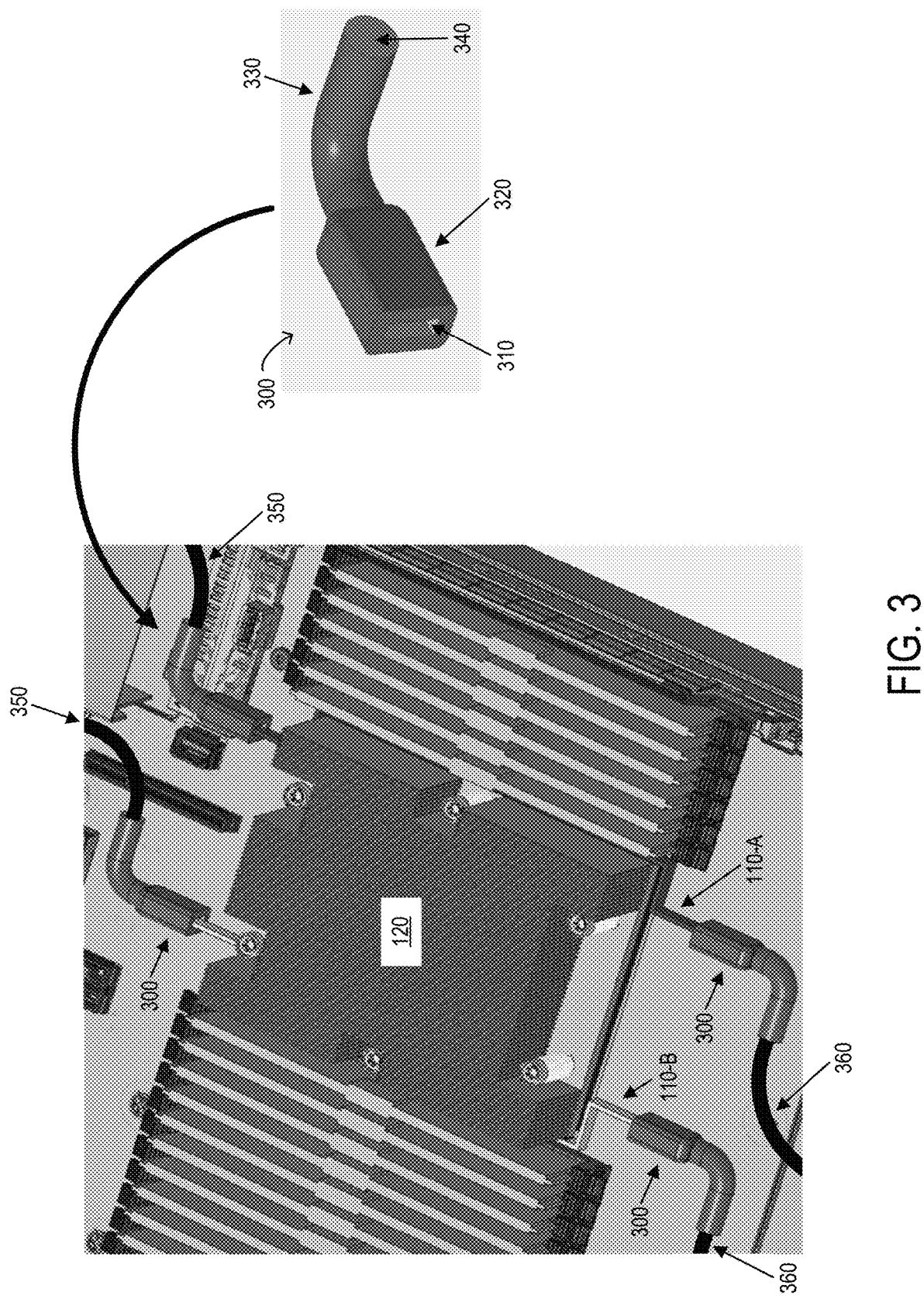
FIG. 3 illustrates selected elements of an embodiment of a power distribution system that includes connectors.

FIG. 3 illustrates selected elements of an embodiment of a power distribution system that includes connectors. In the embodiment illustrated in FIG. 3, connectors 300 may be coupled to each power conductor 110-A and 110-B. Specifically, each power conductor 110-A and 110-B may include a first end coupled to a connector 300 (e.g., connectors 300 coupled to cable 350) and a second end coupled to a connector 300 (e.g., connectors 300 coupled to cable 360). In addition, each connector 300 may be coupled to one or more cables. In particular, connectors 300 coupled to the first end of each power conductor 110-A and 110-B may be coupled to cables 350 shown in FIG. 3. Here, cables 350 may be or include AUX power cables coupled to power supply unit 105 (not shown in figure) such that power conductors 110 may receive power from power supply unit 105 via cables 350. Similarly, cables 360 may be or include AUX power cables coupled to component 125 (not shown in figure) such that power conductors 110 may provide the power received from power supply unit 105 to component 125 via cables 360. In other embodiments, the power distribution system may include additional, fewer, and/or different components than the components shown in FIG. 3.

In the embodiment illustrated in FIG. 3, each connector 300 may be comprised of a rigid material (e.g., thermoplastic, rubber, and the like) and may include a power conductor interface 310, a main body 320, a routing segment 330, and a cable inlet 340. Here, power conductor interface 310 may be contoured, or otherwise configured, to couple connector 300 to an end (i.e., first end and/or second end) of power conductor 110. Main body 320 may be configured to provide a housing used to protect the coupling between one or more cables (e.g., cables 350 and 360) and an end of power conductor 110. Specifically, main body 320 may protect the coupling of one or more cables—used to provide power and management signals to component 125—with one or more interfaces (e.g., power interface 500 and management interface 510 shown in FIG. 5) disposed within main body 320. Routing segment 330 may be configured to partially route a respective segment of one or more cables in relation to power conductor 110 such that the one or more cables may be coupled to power conductor 110 without applying excess stress on the one or more cables and/or the coupling between the one or more cables and an end of power conductor 110. Cable inlet 340 may be configured to receive the one or more cables such that they may be routed through main body 320 to be coupled with an end of power conductor 110. In one embodiment, connector 300 may not include routing segment 330. In this embodiment, cable inlet 340 may be disposed directly onto a surface of main body 320 such that the one or more cables may be routed directly into main body 320 for coupling. In other embodiments, each connector 300 may include additional, fewer, and/or different components than the components shown in FIG. 3.

Figure 4A:
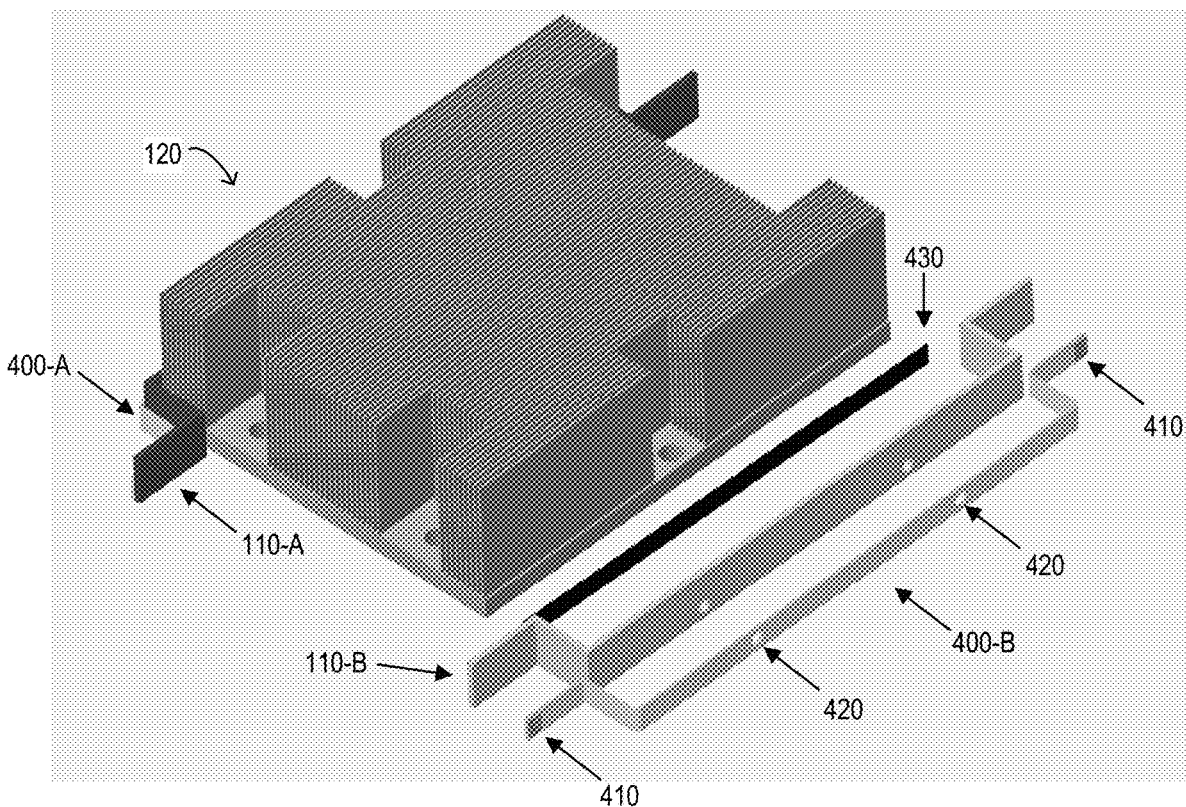
FIGS. 4A and 4B illustrate selected elements of an embodiment of a power distribution system that includes signal distribution circuits coupled to a heatsink.
Figure 4B:
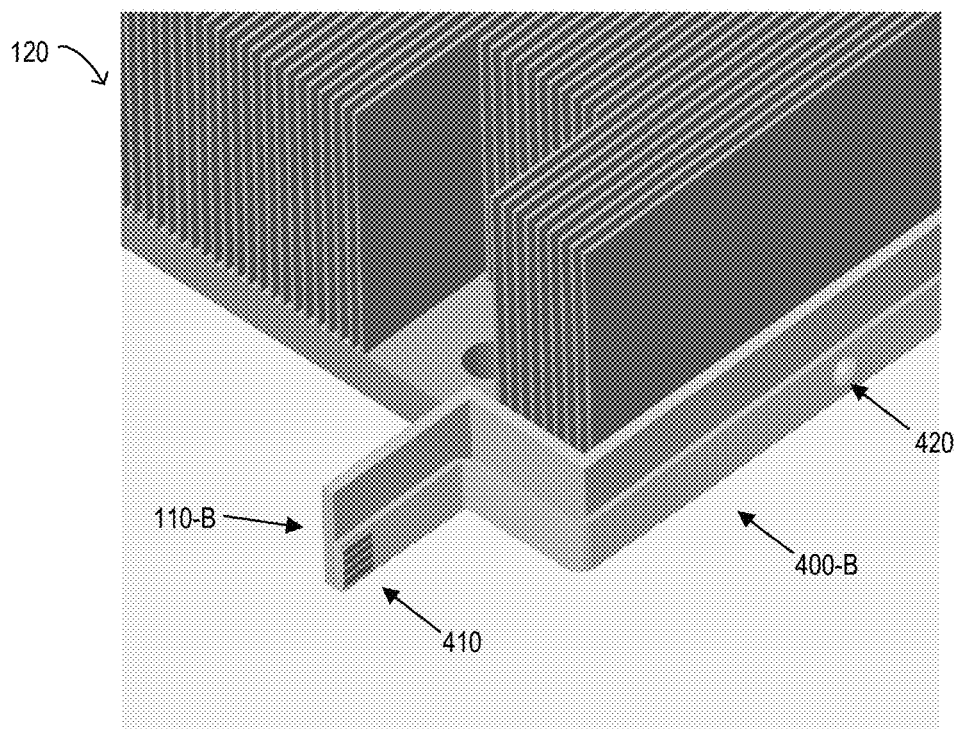

FIGS. 4A and 4B illustrate selected elements of an embodiment of a power distribution system that includes signal distribution circuits coupled to a heatsink. In the embodiment illustrated in FIGS. 4A and 4B, the power distribution system includes heatsink 120 and power conductors 110-A and 110-B as described above with respect to FIG. 2. In addition, the power distribution system includes signal distribution circuits 400-A and 400-B (collectively referred to herein as "signal distribution circuits 400") and insulator 430. In other embodiments, the power distribution system may include additional, fewer, and/or different components than the components shown in FIGS. 4A and 4B.

In one embodiment, each signal distribution circuit 400 may be a suitable system, apparatus, or device operable to transfer, or otherwise distribute, signals to component 125. In particular, signal distribution circuit 400 may be or include an electronic hardware device (e.g., a flexible PCB, rigid-flex PCB, and the like) comprised of a non-conductive substrate with layers of circuitry (e.g., embedded within signal distribution circuit 400 and/or disposed on a surface thereof) operable to receive one or more management signals from information handling system 100 and to provide the one or more management signals to component 125. That is, signal distribution circuit 400 may receive one or more management signals (e.g., power enable signal, I2C bus signal, UART signal, and the like) via signal pins 410 shown in FIGS. 4A and 4B. The one or more management signals may be generated by a user of information handling system 100 (i.e., locally or remotely) such that signal distribution circuit 400 may transfer the one or more management signals to component 125. Component 125 may receive the one or more management signals and operate and/or provide data to the user in accordance with the one or more management signals. Conventionally, such signal distribution from an information handling system to one or more components typically requires complex routing schemes through multiple devices disposed upon a surface of a motherboard, or other architecture, within a chassis of the information handling system. For example, one or more management signals may be routed from a baseboard management controller (BMC) (not shown in figure) of an information handling system to one or more components underneath the multiple devices as described above with respect to FIG. 1. Similarly, one or more management signals may be routed to one or more components via a management cable routed between devices and an interior wall of the chassis within an information handling system. However, such conventional solution may increase cost and/or require modifications to the existing architecture.

In contrast, signal distribution circuit 400 may be contoured to be removably coupled to one or more devices of information handling system 100 such that one or more management signals generated by information handling system 100 may be provided to component 125 without requiring modification to the existing chassis architecture. As shown in FIGS. 4A and 4B, signal distribution circuit 400 may include one or more right angles such that the body of signal distribution circuit 400 may be removably coupled to both power conductor 110 and heatsink 120 via screw holes 420. For example, signal distribution circuit 400 may be removably coupled to power conductor 110 and to heatsink 120 via screw holes 420 proximate to the base of heatsink 120 such that one or more management signals may be routed around heatsink 120 and provided to component 125. In this embodiment, the power distribution system may additionally include insulator 430 to further electrically isolate both power conductor 110 and signal distribution circuit 400 from heatsink 120. For example, insulator 430 may be wedged, or otherwise positioned between, an interior surface of power conductor 110 and heatsink 120 (as shown in FIG. 4A) to electrically isolate power conductor 110 and signal distribution circuit 400 from heatsink 120, thereby preventing one or more fins of heatsink 120 from becoming energized. In another embodiment, signal distribution circuit 400 may include a cradle unit (e.g., as shown in FIG. 6) disposed within one or more recessed portions of heatsink 120 such that the one or more management signals may be routed accordingly. In other embodiments, signal distribution circuit 400 may be routed through an interior portion of heatsink 120, routed underneath heatsink 120, routed above heatsink 120, and/or any other routing scheme suitable for providing one or more management signals to component 125. In one embodiment, signal distribution circuit 400 may be or include a flexible PCB. In other embodiments, signal distribution circuit 400 may be or include a single-sided PCB, a double-sided PCB, a multilayer PCB, a rigid PCB, and/or any other type of system, apparatus, or device suitable to transfer, or otherwise distribute, signals to component 125. In one embodiment, signal distribution circuit 400 may be removably coupled directly to heatsink 120. In this embodiment, the power distribution system may not include power conductor 110.

Figure 5:
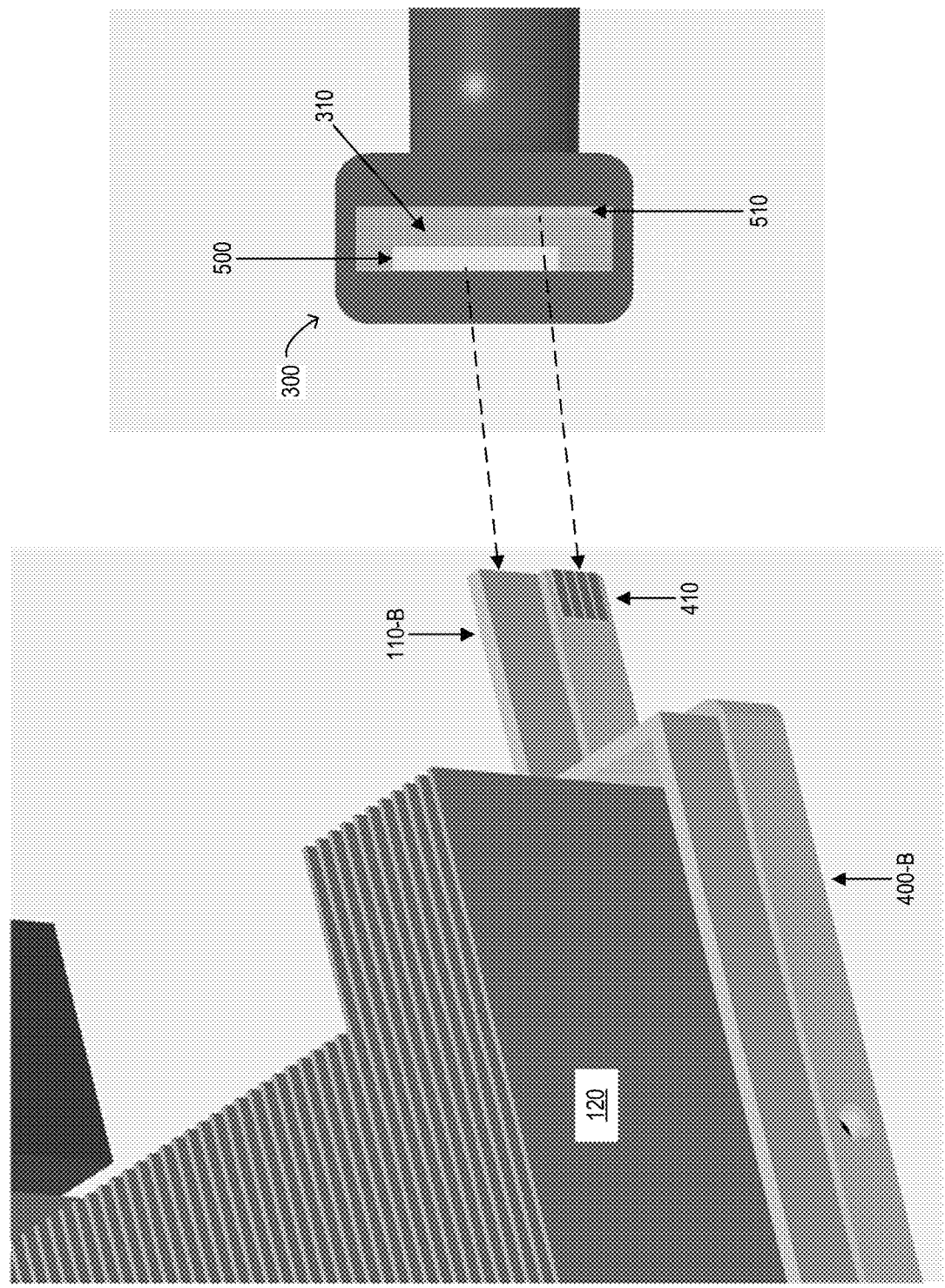
FIG. 5 illustrates selected elements of an embodiment of a connector that includes a power interface and a management interface.
Figure 6:
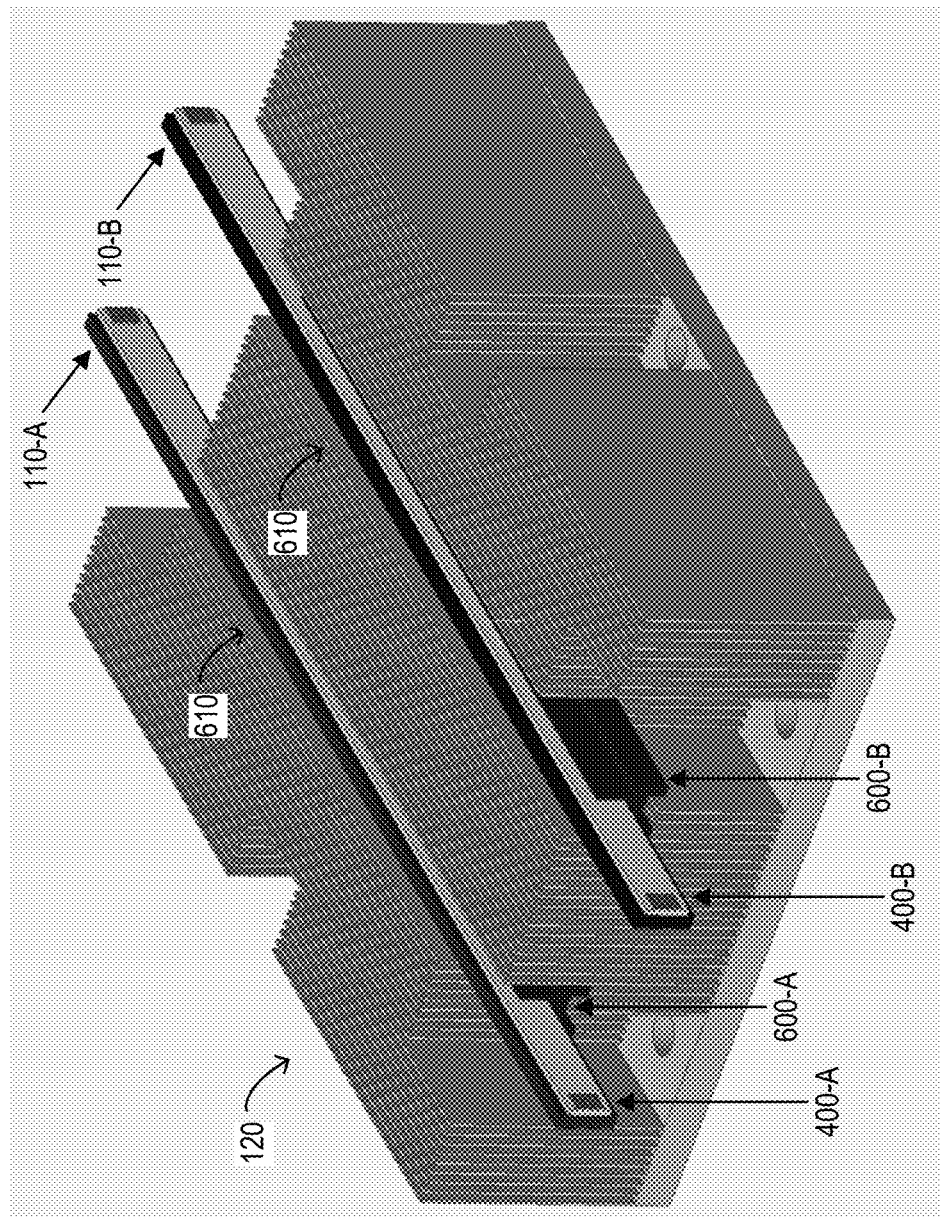
FIG. 6 illustrates selected elements of an embodiment of a power distribution system that includes a heatsink having recessed portions.

FIG. 5 illustrates selected elements of an embodiment of a connector that includes a power interface and a management interface. In the embodiment illustrated in FIG. 5, connector 300 may be comprised of a rigid material (e.g., thermoplastic, rubber, and the like) and may include a power conductor interface 310, a main body 320, a routing segment 330, and a cable inlet 340 as described above with respect to FIG. 3. In addition, connector 300 may include a power interface 500 and a management interface 510. In other embodiments, connector 300 may include additional, fewer, and/or different components than the components shown in FIG. 5.

In one embodiment, power interface 500 may be a suitable system, apparatus, or device operable to transfer power to, and/or receive power from, power conductor 110. In particular, power interface 500 may be or include a conductive material (e.g., copper, brass, aluminum, and the like) operable to transfer power to, and/or receive power from, an end of power conductor 110. As shown in FIG. 5, power interface 500 may be disposed on an interior surface of power conductor interface 310 such that power interface 500 may align with an end of power conductor 110 to become electrically coupled with power conductor 110. It is noted that although the embodiment of connector 300 illustrated in FIG. 5 includes a single power interface 500, other embodiments of connector 300 may include any number of power interfaces 500 suitable for transferring power to, and/or receiving power from, power conductor 110.

In one embodiment, management interface 510 may be a suitable system, apparatus, or device operable to transfer one or more management signals to, and/or receive one or more management signals from, signal distribution circuit 400 (i.e., via signal pins 410). Specifically, management interface 510 may be or include one or more pins comprised of a conductive material (e.g., copper, brass, aluminum, and the like) operable to transfer one or more management signals to, and/or receive one or more management signals from, signal pins 410 disposed proximate to an end of signal distribution circuit 400. As shown in FIG. 5, management interface 510 may be disposed on an interior surface of power conductor interface 310 such that each of the one or more pins comprising management interface 510 may align with signal pins 410 disposed proximate to an end of signal distribution circuit 400 to become communicably coupled with signal distribution circuit 400. It is noted that although the embodiment of connector 300 illustrated in FIG. 5 includes a single management interface 510, other embodiments of connector 300 may include any number of management interfaces 510 suitable for transferring one or more management signals to, and/or receiving one or more management signals from, signal distribution circuit 400.

FIG. 6 illustrates selected elements of an embodiment of a power distribution system that includes a heatsink having recessed portions. In the embodiment illustrated in FIG. 6, heatsink 120 includes two recessed portions 610 disposed upon a surface of heatsink 120. The power distribution system includes power conductors 110-A and 110-B coupled to signal distribution circuits 400-A and 400-B, respectively. In addition, the power distribution system includes cradle units 600-A and 600-B (collectively referred to herein as "cradle units 600") disposed within recessed portions 610 of heatsink 120. In other embodiments, the power distribution system may include additional, fewer, and/or different components than the components shown in FIG. 6.

In one embodiment, each cradle unit 600 may be a suitable system, apparatus, or device operable to removably couple power conductors 110-A and 110-B and signal distribution circuits 400-A and 400-B to heatsink 120. Specifically, cradle unit 600 may be comprised of a rigid material (e.g., plastic, rubber, and the like) operable to mount power conductors 110 and/or signal distribution circuits 400 within recessed portions 610 of heatsink 120. In addition, cradle unit 600 may serve as an insulator to electrically isolate power conductors 110 and/or signal distribution circuits 400 from heatsink 120, thereby preventing one or more fins of heatsink 120 from becoming energized. In one embodiment, cradle unit 600 may be removably coupled to heatsink 120 via one or more screws or rivets. In other embodiments, cradle unit 600 may be glued to heatsink 120 and/or fastened to heatsink 120 using one or more mechanical fasteners. It is noted that although the embodiment of heatsink 120 illustrated in FIG. 6 includes two recessed portions 610 and two cradle units 600, other embodiments of heatsink 120 may include any number of recessed portions 610 and cradle units 600 suitable for removably coupling power conductors 110 and signal distribution circuits 400 to heatsink 120.

FIG. 7 is a flowchart depicting selected elements of an embodiment of a method for distributing power using a power distribution system for an information handling system. It is noted that certain operations described in method 700 may be optional or may be rearranged in different embodiments.

Method 700 may begin at step 710, where a first power distribution end of a power conductor of the power distribution system may receive power from a power supply unit via a first cable coupled to the power supply unit. The first power distribution end may be coupled to a first connector. The first connector may include a first power interface coupling the first power distribution end to the first cable. The power conductor may be contoured to removably couple to a heatsink of the information handling system. For example, each power conductor 110-A and 110-B may include a first end coupled to a connector 300 (e.g., connectors 300 coupled to cable 350) as described above with respect to FIG. 3. In addition, connectors 300 coupled to the first end of each power conductor 110-A and 110-B may be coupled to cables 350 shown in FIG. 3. Here, cables 350 may be or include AUX power cables coupled to power supply unit 105 such that power conductors 110 may receive power from power supply unit 105 via cables 350 as described above with respect to FIG. 3. Power interface 500 may be disposed on an interior surface of power conductor interface 310 of connector 300 such that power interface 500 may align with an end of power conductor 110 to become electrically coupled with power conductor 110 as describe above with respect to FIG. 5. Power conductors 110 may be contoured to removably couple to heatsink 120 such that no modification to heatsink 120 and/or the existing chassis architecture is required as described above with respect to FIG. 2. In step 720, a second power distribution end of the power conductor may provide the power to a component of the information handling system via a second cable coupled to the component. The second power distribution end may be coupled to a second connector. The second connector may include a second power interface coupling the second power distribution end to the second cable. For example, each power conductor 110-A and 110-B may include a second end coupled to a connector 300 (e.g., connectors 300 coupled to cable 360) as described above with respect to FIG. 3. In addition, connectors 300 coupled to the second end of each power conductor 110-A and 110-B may be coupled to cables 360 shown in FIG. 3. Here, cables 360 may be or include AUX power cables coupled to component 125 such that power conductors 110 may provide the power received from power supply unit 105 to component 125 via cables 360 as described above with respect to FIG. 3.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A power distribution system for an information handling system, comprising:
   a power supply unit;
   a power conductor contoured to removably couple to a heatsink of the information handling system, the power conductor including:
      a first power distribution end coupled to a first connector, the first connector including a first power interface coupling the first power distribution end to a first cable, the first cable coupled to the power supply unit, the first power distribution end configured to receive power from the power supply unit via the first cable; and
      a second power distribution end coupled to a second connector, the second connector including a second power interface coupling the second power distribution end to a second cable, the second cable coupled to a component of the information handling system, the second power distribution end configured to provide the power to the component via the second cable.

2. The power distribution system of claim 1, wherein the power distribution system further comprises:
   a signal distribution circuit contoured to removably couple to the power conductor and the heatsink, the signal distribution circuit including:
      a first signal distribution end coupled to the first connector, the first connector including a first management interface communicably coupling the first signal distribution end to the first cable, the first signal distribution end configured to receive one or more management signals from the information handling system via the first cable; and
      a second signal distribution end coupled to the second connector, the second connector including a second management interface communicably coupling the second signal distribution end to the second cable, the second signal distribution end configured to provide the one or more management signals to the component via the second cable.

3. The power distribution system of claim 2, wherein the signal distribution circuit comprises a flexible printed circuit board (PCB).

4. The power distribution system of claim 1, wherein the power conductor is contoured to removably couple to the heatsink proximate to a base of the heatsink.

5. The power distribution system of claim 1, wherein the power conductor is contoured to removably couple to the heatsink via a cradle unit disposed within a recessed portion of the heatsink.

6. The power distribution system of claim 1, wherein the power conductor is electrically isolated from the heatsink.

7. The power distribution system of claim 1, wherein the power conductor comprises a busbar.

8. A method for distributing power using a power distribution system for an information handling system, the method comprising:
   receiving, by a first power distribution end of a power conductor of the power distribution system, power from a power supply unit via a first cable coupled to the power supply unit, the first power distribution end coupled to a first connector, the first connector including a first power interface coupling the first power distribution end to the first cable, the power conductor contoured to removably couple to a heatsink of the information handling system; and
   providing, by a second power distribution end of the power conductor, the power to a component of the information handling system via a second cable coupled to a component of the information handling system, the second power distribution end coupled to a second connector, the second connector including a second power interface coupling the second power distribution end to the second cable.

9. The method of claim 8, further comprising:
   receiving, by a first signal distribution end of a signal distribution circuit of the power distribution system, one or more management signals from the information handling system via the first cable, the first signal distribution end coupled to the first connector, the first connector including a first management interface communicably coupling the first signal distribution end to the first cable, the signal distribution circuit contoured to removably couple to the power conductor and the heatsink; and
   providing, by a second signal distribution end of the signal distribution circuit, the one or more management signals to the component via the second cable, the second signal distribution end coupled to the second connector, the second connector including a second management interface communicably coupling the second signal distribution end to the second cable.

10. The method of claim 9, wherein the signal distribution circuit comprises a flexible printed circuit board (PCB).

11. The method of claim 8, wherein the power conductor is contoured to removably couple to the heatsink proximate to a base of the heatsink.

12. The method of claim 8, wherein the power conductor is contoured to removably couple to the heatsink via a cradle unit disposed within a recessed portion of the heatsink.

13. The method of claim 8, wherein the power conductor is electrically isolated from the heatsink.

14. The method of claim 8, wherein the power conductor comprises a busbar.

15. A power conductor for an information handling system, comprising:
   a first power distribution end coupled to a first connector, the first connector including a first power interface coupling the first power distribution end to a first cable, the first cable coupled to the power supply unit, the first power distribution end configured to receive power from the power supply unit via the first cable, the power conductor contoured to removably couple to a heatsink of the information handling system; and
   a second power distribution end coupled to a second connector, the second connector including a second power interface coupling the second power distribution end to a second cable, the second cable coupled to a component of the information handling system, the second power distribution end configured to provide the power to the component via the second cable.

16. The power conductor of claim 15, wherein the power conductor is removably coupled to a signal distribution circuit, the signal distribution circuit contoured to removably couple to the power conductor and the heatsink, the signal distribution circuit including:
- a first signal distribution end coupled to the first connector, the first connector including a first management interface communicably coupling the first signal distribution end to the first cable, the first signal distribution end configured to receive one or more management signals from the information handling system via the first cable; and
- a second signal distribution end coupled to the second connector, the second connector including a second management interface communicably coupling the second signal distribution end to the second cable, the second signal distribution end configured to provide the one or more management signals to the component via the second cable.

17. The power conductor of claim 15, wherein the power conductor is contoured to removably couple to the heatsink proximate to a base of the heatsink.

18. The power conductor of claim 15, wherein the power conductor is contoured to removably couple to the heatsink via a cradle unit disposed within a recessed portion of the heatsink.

19. The power conductor of claim 15, wherein the power conductor is electrically isolated from the heatsink.

20. The power conductor of claim 15, wherein the power conductor comprises a busbar.

* * * * *